United States Patent [19]
Uesugi et al.

[11] Patent Number: 5,708,286
[45] Date of Patent: Jan. 13, 1998

[54] INSULATED GATE SEMICONDUCTOR DEVICE AND FABRICATION METHOD THEREFOR

[75] Inventors: Tsutomu Uesugi, Seto; Masahito Kodama, Komaki, both of Japan

[73] Assignee: Kabushiki Kaisha Toyota Chuo Kenkyusho, Aichi-ken, Japan

[21] Appl. No.: 623,702

[22] Filed: Mar. 29, 1996

[30] Foreign Application Priority Data

Mar. 31, 1995 [JP] Japan .................. 7-099685

[51] Int. Cl.⁶ .............. H01L 29/76; H01L 29/94; H01L 31/062; H01L 31/113
[52] U.S. Cl. .............. 257/330; 257/328; 257/329; 257/331
[58] Field of Search .............. 257/328–31

[56] References Cited

U.S. PATENT DOCUMENTS 5,378,655  1/1995  Hutchings et al. .............. 437/203
5,504,360  4/1996  Tokura et al. .............. 257/342
5,554,862  9/1996  Omura et al. .............. 257/137

FOREIGN PATENT DOCUMENTS 4-356966  12/1992  Japan .

Primary Examiner—Tom Thomas
Assistant Examiner—Howard Weiss
Attorney, Agent, or Firm—Oblon, Spivak, McClelland, Maier & Neustadt, P.C.

[57] ABSTRACT

A vertical semiconductor device having an insulated gate structure makes use of a double-gate structure. The double-gate structure dramatically reduces the channel resistance, JFET resistance, and epitaxial resistance of the on-resistance of the power MOSFET, and implements an adequate breakdown voltage due to the effect of gate bias. In principle, a first gate and second gate having mutually facing portions are driven synchronously. This causes first and second channels to be formed in correspondence with first and second gates, and the currents flowing through these first and second channels form the on-current for this power device having a vertical structure.

11 Claims, 25 Drawing Sheets

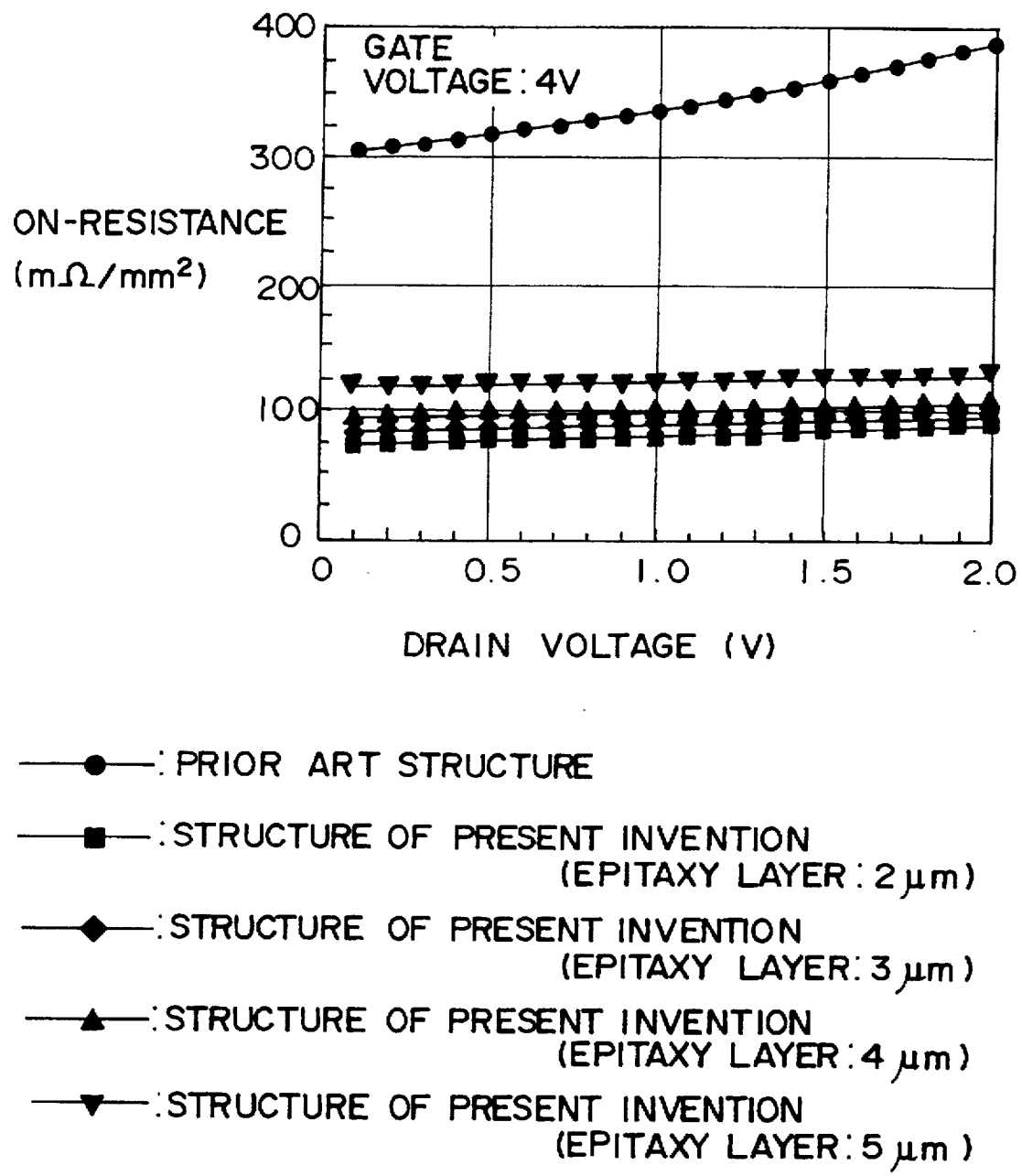

O: STRUCTURE OF PRESENT INVENTION
●: PRIOR-ART STRUCTURE

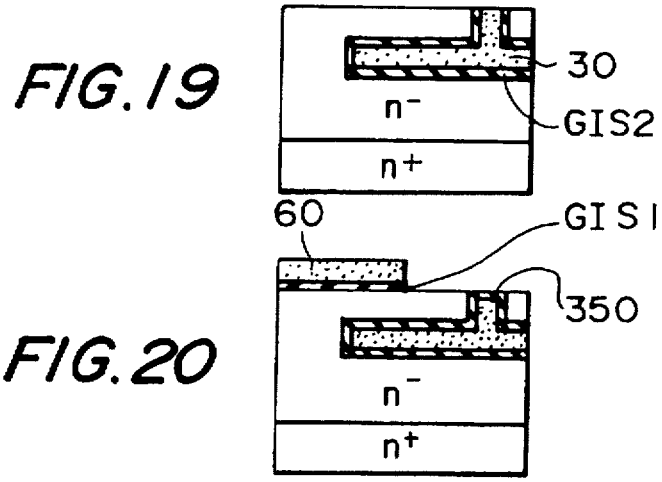
FIG. 19
FIG. 20
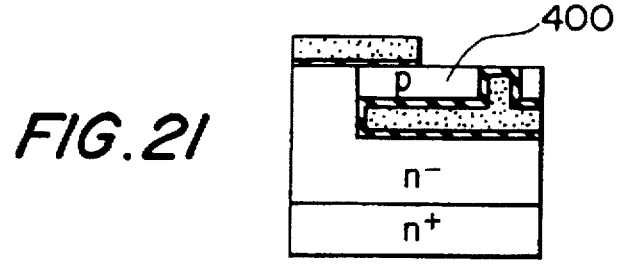
FIG. 21
FIG. 22
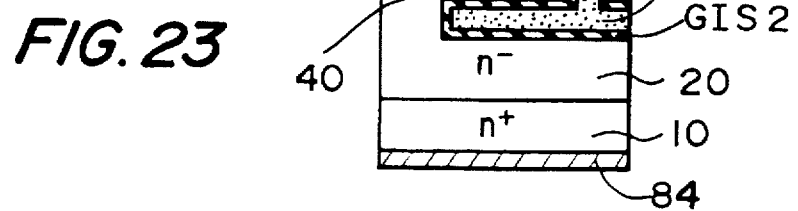
FIG. 23

INSULATED GATE SEMICONDUCTOR DEVICE AND FABRICATION METHOD THEREFOR

BACKGROUND OF THE INVENTION

This invention relates to an insulated gate semiconductor device and, in particular, to a MOS power device having a vertical structure, such as a power MOSFET or an insulated gate bipolar transistor (IGBT).

Demand has recently strengthened for a MOS power device that has an on-resistance that is smaller than that currently available.

Consider a case in which an actuator (load) AC is driven by a power MOS device M1, as shown for example in FIG. 46.

If the on-resistance of this power MOS device M1 is large, a large amount of heat is generated within the device and thus the device is likely to fail. Furthermore, this large on-resistance causes a large voltage drops (which is determined by the product of the operating current $I_p$ and the on-resistance of the power MOS device M1), which makes it difficult to supply a sufficient voltage to the actuator (AC). An increase in chip area leads to an increase in cost, and thus there is a demand for a reduction in the on-resistance per unit area.

To meet this demand, it is necessary to reduce a unit cell size of the device, or employ a UMOS structure having trench gates in which a U-shaped groove 510 (trench gate) is formed perpendicularly in part of a body region 500, as shown in FIG. 44.

However, there are technical limits to reduce a device size and it is also essential to ensure the necessary breakdown voltage, so that the reduction of on-resistance by reducing the size of the device is approaching the limit.

In other words, the on-resistance of a power MOS device with a prior-art structure is determined by the source resistance $R_S$, channel resistance $R_{ch}$, Junction FET (JFET) resistance $R_{JFET}$, epitaxial layer resistance $R_{epi}$, and substrate resistance $R_{sub}$, as shown schematically in FIG. 43. Since $R_S$ and $R_{sub}$ are determined in principle by the fabrication process and $R_{JFET}$ is determined in principle by the distance between neighboring body regions, reductions in these components have reached their limits.

$R_{ch}$ and $R_{epi}$ are closely related to the generation of punch-through and reach-through caused by expansion of a depletion layer, and thus have a direct effect on the breakdown voltage of elements, so they impose a limit on reduction of the device size as seen from the viewpoint of reliability.

A UMOS structure shown in FIG. 44 has a problem in that etching damage can occur in the substrate during fabrication of the trench gate. That is, when the substrate is being etched by reactive ion etching (RIE), damage can occur in the substrate, reducing carrier mobility. This means that the actual on-resistance of a UMOS device is considerably higher than the theoretical value.

A new ultra-small structure in which a source region 1300 and a channel region 1400 are formed between two trench gates 1000 and 1100, shown in FIG. 45 has been proposed. The width W4 of this channel is, for example, 0.1 µm. Reference numbers 1500 and 1600 in this figure denote drain regions.

However, the accurate fabrication of such a compact structure is difficult in practice, and it is also difficult to ensure a reliable connection of a source electrode 1200 to the source region 1300.

A MOS transistor having a double-gate structure is shown in Japanese Patent Application Laid-Open No. 4-356966. However, this MOS transistor is a lateral-type, ultra-small element for high-speed logic circuitry, mainly aimed at a further increase in chip integration and an improvement in operating speed. Therefore, this MOS transistor is quite different in use and functions from a vertical power transistor that is the subject of this invention.

In other words, the transistor described in the above Application cannot solve the above problems in the field of vertical power transistors.

SUMMARY OF THE INVENTION

An object of this invention is to provide an insulated gate semiconductor device which has an extremely small on-resistance but an adequate breakdown voltage, and which can be realized by a fabrication process that is at a general level of technical expertise (such as a minimum line width of 2 µm). It also provides a method of fabricating such an insulated gate semiconductor device.

A vertical semiconductor device with an insulated gate structure of this invention comprising:

a semiconductor substrate as a drain region;

a channel region formed within the semiconductor substrate;

a source region formed in contact with the channel region; and a first gate and a second gate formed on one surface side of the semiconductor substrate, the first and second gates being electrically insulated from the semiconductor substrate and having mutually opposing portions; wherein first and second channels corresponding to the first and second gates are formed in the channel region by driving the first and second gates so that currents flow through the first and second channels from another surface side of the semiconductor substrate to the one surface side thereof.

A method of fabricating a vertical semiconductor device with an insulated gate structure of this invention in one preferred mode comprising the steps of:

selectively forming a spacer on a major surface of a singlecrystalline semiconductor substrate;

forming a non-singlecrystalline layer in such a manner as to cover the major surface of the singlecrystalline semiconductor substrate and the spacer;

forming an aperture portion in part of the non-singlecrystalline layer in such a manner that part of the surface of the spacer is exposed, and then supplying an etchant through the aperture portion to remove the spacer by etching and thus form a cavity portion corresponding to the portion previously occupied by the spacer;

converting the non-singlecrystalline layer defining outer walls of the cavity portion to a singlecrystalline layer by laser beam irradiation, electron beam irradiation, or solid phase epitaxy (SPE) using annealing;

forming an insulating layer on an inner surface of the cavity portion, and then filling a conductive material into the cavity portion so as to form a second gate;

forming an insulating layer on part of the surface of the singlecrystalline layer, and then forming a first gate of a conductive material on the insulating layer;

doping a first conductive type impurity into the single crystalline layer using the first gate as a mask to form a first conductive type body layer; and doping a second conductive type impurity into the body layer using the first gate as a mask to form a second conductive type source region and, as a result, to form a first conductive type channel region;

thereby enabling the formation of first and second channels in the channel region by driving the first and second gates.

With this invention, the use of a double-gate structure having two gates dramatically reduces the magnitudes of $R_{JFET}$, $R_{ch}$, and $R_{epi}$, which form the bulk of the on-resistance of a power MOS device. The cross-sectional area of the channel is made to be twice that of the prior-art structure by forming a channel between the two gates, so that the channel resistance $R_{ch}$ is approximately half that of the prior art.

In a preferred aspect of this invention, the second gate is buried within the semiconductor substrate, a carrier accumulation layer (low-resistance layer) is formed around the periphery of this second gate, and the on-current of the transistor flows through this carrier accumulation layer. In other words, a current path is formed in a region where a depletion layer is formed in the prior-art structure and thus no current flows therethrough. This innovative action enables a huge reduction in the JFET resistance, without generating local current concentrations.

In another preferred aspect of this invention, the buried second gate prevents diffusion of impurities into the depthwise direction within the substrate, so that the thickness of the channel region (the region corresponding to the body p-layer in the prior-art structure) can be reduced. This enables a reduction in the thickness of the epitaxial layer, and thus the epitaxial layer resistance $R_{epi}$ is reduced.

In a further preferred aspect of this invention, the second gate is held at a predetermined potential (such as ground) when the semiconductor device is off, instead of floating. When the device is off, the biasing effect of the second gate ensures that the lines of electrostatic potential spread out in a substantially parallel manner in the vertical direction within the semiconductor substrate, improving the breakdown voltage over that of the prior-art structure.

In a still further preferred aspect of this invention, the first and second gate electrodes are both formed on the same semiconductor surface. This simplifies the fabrication of the device.

In a yet further aspect of this invention, an extremely narrow channel region sandwiched between the first and second gates is completely depleted when the device is on. This complete depletion of the channel region weakens the electrical field and thus increases carrier mobility. This enables a further reduction in the on-resistance of the transistor.

The semiconductor device of this invention can be fabricated by using solid phase epitaxy (SPE) to convert an amorphous semiconductor layer into a single crystal. In other words, the structure of this invention can be fabricated from a stack of layers, using silicon-on-insulator (SOI) techniques used in the configuration of three-dimensional devices.

Thus there is no need for the excess etching of the singlecrystalline semiconductor substrate by RIE needed in the fabrication of the UMOS transistor of the prior art. The device of this invention can be fabricated accurately by LSI fabrication techniques of an ordinary level. Since carriers move horizontally in the channels, in the same manner as in the prior art planar device, a carrier mobility can be achieved in the channel region that is at least equivalent to ordinary bulk devices.

The gate oxide film of the second gate can be formed in the same manner as that of an ordinary planar MOSFET, and thus the degree of control over the thickness thereof is similar to that of conventional LSI fabrication techniques. The channel regions can be formed by diffusion self-alignment (DSA), and thus the degree of control over the channel length can be ensured to be similar to that of existing processing techniques. Therefore a double-gate structure can be fabricated extremely accurately and with good repeatability.

BRIEF DESCRIPTION OF THE DRAWINGS

FIG. 5 is a diagram used to illustrate the flow of current when the device of the embodiment of FIG. 1 is on;

FIG. 10 is a graph showing the relationship between drain voltage (the abscissa) and on-resistance (the ordinate) in the embodiment of FIG. 1 when the gate voltage is 4 V;

FIGS. 13 to 23 are cross-sectional views through the device, showing first to eleventh steps, respectively, in the method of fabricating the structure of the embodiment of FIG. 1;

DETAILED DESCRIPTION OF THE PREFERRED EMBODIMENTS

Preferred embodiments of this invention will now be described with reference to the accompanying drawings.

Embodiment 1

Figure 1:
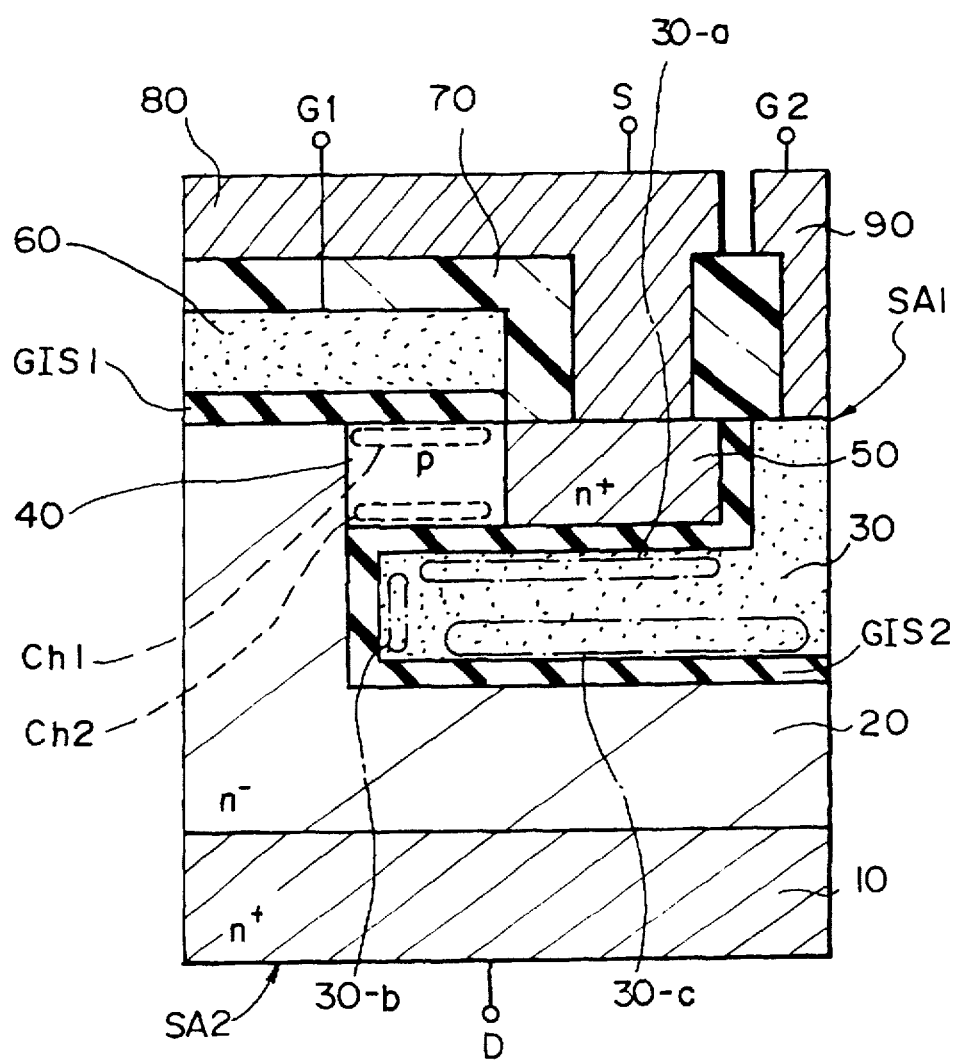
FIG. 1 is a cross-sectional view through the structure of a cell in one embodiment of the insulated gate semiconductor device (power MOSFET) in accordance with this invention.

A cross-sectional view through the structure of a power MOSFET in a first embodiment of the present invention is shown in FIG. 1.

1. Structure

The structure of the device of this embodiment will first be described.

This embodiment concerns a vertical power MOSFET wherein an $n^-$-type drain layer (epitaxial layer) 20 is formed on an $n^+$-type drain layer 10, and a second gate 30 is buried in this $n^-$-type drain layer 20.

The second gate 30 is formed of polysilicon and is electrically insulated from the $n^-$-type drain layer 20 by a gate insulating film GIS2 that covers the surface thereof.

Another gate insulating film GIS1 is formed on one surface SA1 of a semiconductor substrate, and a first insulated gate 60 is formed on this gate insulating film GIS1. The first gate 60 is also formed of polysilicon.

A channel region (corresponding to the p-type body layer of the prior art) 40 is formed in the region between the first and second gates 60 and 30. An $n^+$-type source region 50 is formed adjacent to this channel region 40.

Note that reference number 70 denotes an inter-layer insulating film, number 80 denotes a source electrode S, and reference number 90 denotes a second gate electrode G2. A drain electrode D is formed on a lower surface SA2 of the semiconductor substrate.

In principle, the first and second gates 60 and 30 are driven in an linked manner, that is, synchronously. Since this embodiment concerns an n-type MOS transistor, the potential of each gate when on is positive with respect to the source.

2. Features

Figure 3A:
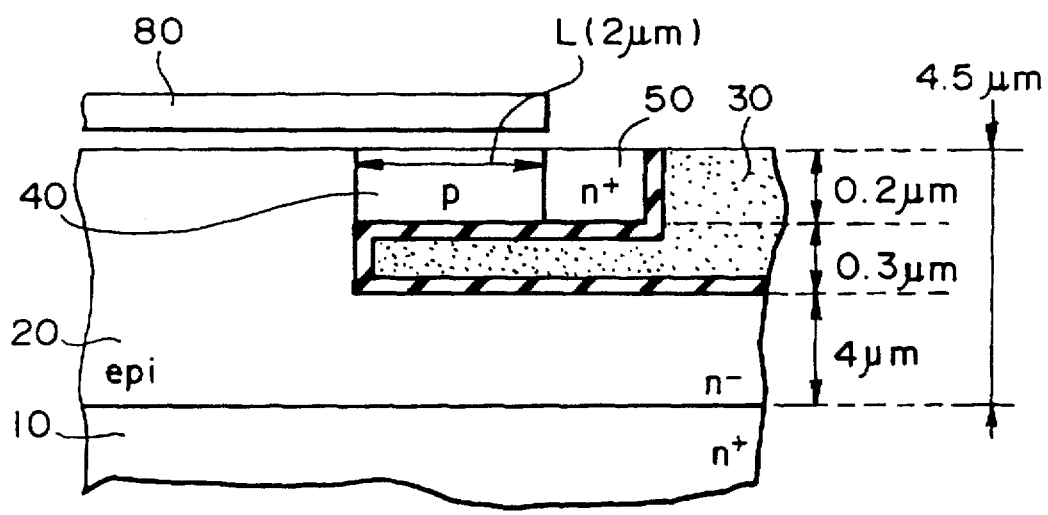
FIG. 3A is a cross-sectional view through the device of this embodiment, to illustrate the reason why the thickness of the device of this embodiment can be reduced.
Figure 5:
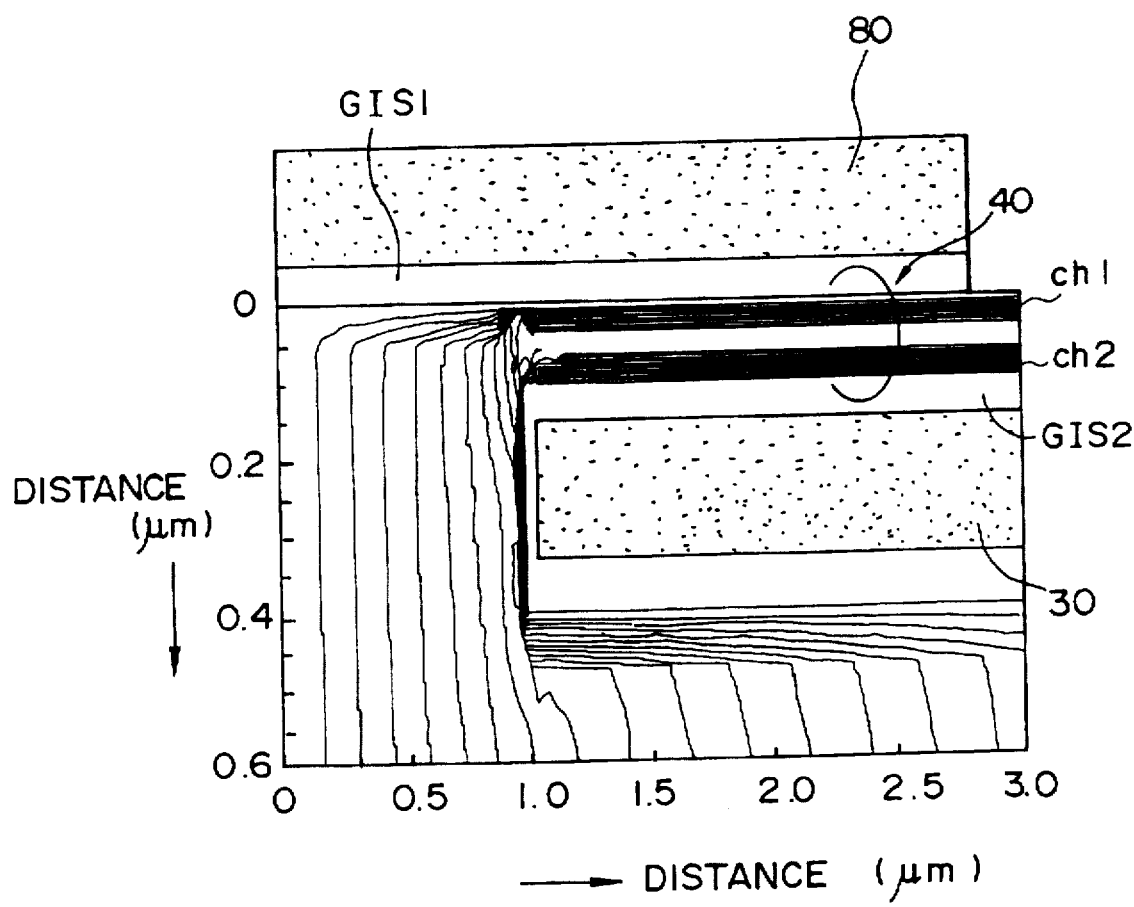

The operation of the device of this embodiment was investigated by computer simulation to analyze the distinctive features of the device of this embodiment, as shown in FIG. 5. The dimensions of the semiconductor device used in the simulation were as shown in FIG. 3A.

a. The formation of two channels around the above described two gates in this embodiment ensures that the total cross-sectional area of the channels is twice that of the prior art and thus the channel resistance $R_{ch}$ is reduced to approximately half that in the prior art.

In general, the channel resistance $R_{ch}$ of a power MOS, whose breakdown voltage is less than 100 V accounts for approximately half of the entire on-resistance, so that the effect obtained by the present invention should make a dramatic difference.

The results of analysis of current flows by computer simulation are shown in FIG. 5. It is clear from this figure that two channels (Ch1 and Ch2) are formed in correspondence to the first and second gates, and currents flow through both channels.

b. In this structure, the thickness of the $n^-$-type drain layer 20 can be made 1.5 µm less than that of the prior art structure, as can be seen from a comparison of FIGS. 3A and 3B.

Figure 3B:
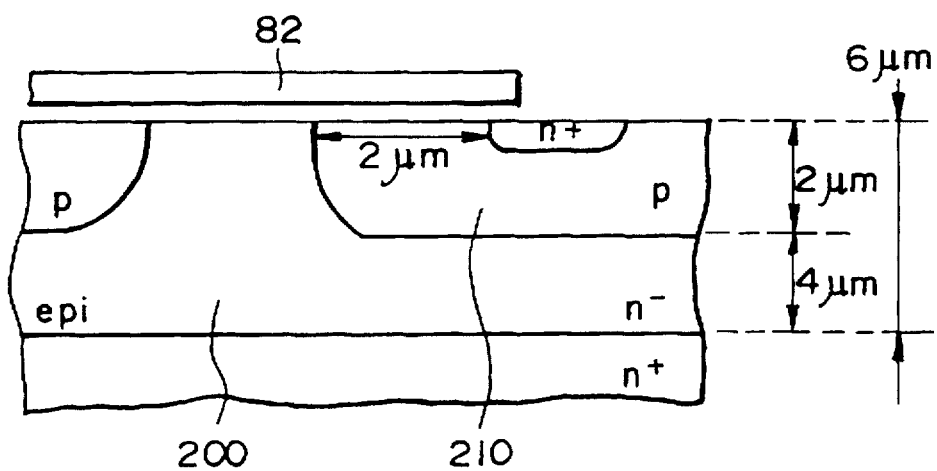
FIG. 3B is a cross-sectional view through a prior art device for comparison.

In other words, in case of the prior art, the impurities are implanted into the substrate through the polysilicon windows and diffused, in order to form the p-type body region. Then, the impurities are diffused not only in the horizontal direction but also in the vertical direction as shown in FIG. 3B. This means that, if the channel length is assumed to be 2 µm, the depth of the p-type body layer 210 is approximately 2 µm. From consideration of the breakdown voltage, it is necessary to ensure that the thickness of an $n^-$-type epitaxial layer 200 below the p-type body layer 210 is at least 4 µm, so that the thickness of the entire $n^-$-type epitaxial layer 200 has to be 6 µm.

In contrast, the presence of the second gate in the device of the embodiment shown in FIG. 3A prevents the diffusion of impurities in the vertical direction. Therefore, the thickness of the channel region 40 can be reduced to 0.2 µm, while ensuring that the channel length L of the channel region 40 is the same 2 µm as in the example shown in FIG. 3B. The thickness of the buried second gate 30 is 0.3 µm. Therefore, even when the thickness of the channel region is added to that of the second gate, the total thickness is only 0.5 µm. This means that the thickness of the entire epitaxial layer 20 can be reduced to 4.5 µm.

The breakdown voltage of the device of this embodiment is substantially determined by the thickness of the part of the epitaxial layer 20 that is below the second gate 30. In other words, most of the reverse voltage in this structure is applied to the epitaxial layer below the second gate 30, and the channel region is virtually unaffected thereby. This fact has been clarified by investigation of the breakdown voltage characteristics by computer simulation.

Thus the epitaxial layer resistance $R_{epi}$ can be reduced in the structure of this embodiment, with no sacrifice of breakdown voltage.

c. In this embodiment, the second gate 30 is buried in the semiconductor substrate and a carrier accumulation layer (low-resistance layer) is created around this gate. Then, the current flows through this region. This greatly reduces the JFET resistance.

The second gate 30 shown in FIG. 1 has a first portion 30-a facing the first gate 60, a second portion 30-b equivalent to the thickness of the second gate 30, and a third portion 30-c facing the drain (the lower surface SA2 of the semiconductor substrate), and a layer in which electrons accumulate is formed around the second gate 30 during the formation of the channel.

This accumulation layer has an extremely low resistance, so that, when the device is on, current flows directly into the accumulation layer from the drain, then flows along the second gate until it reaches the source.

Figure 6:
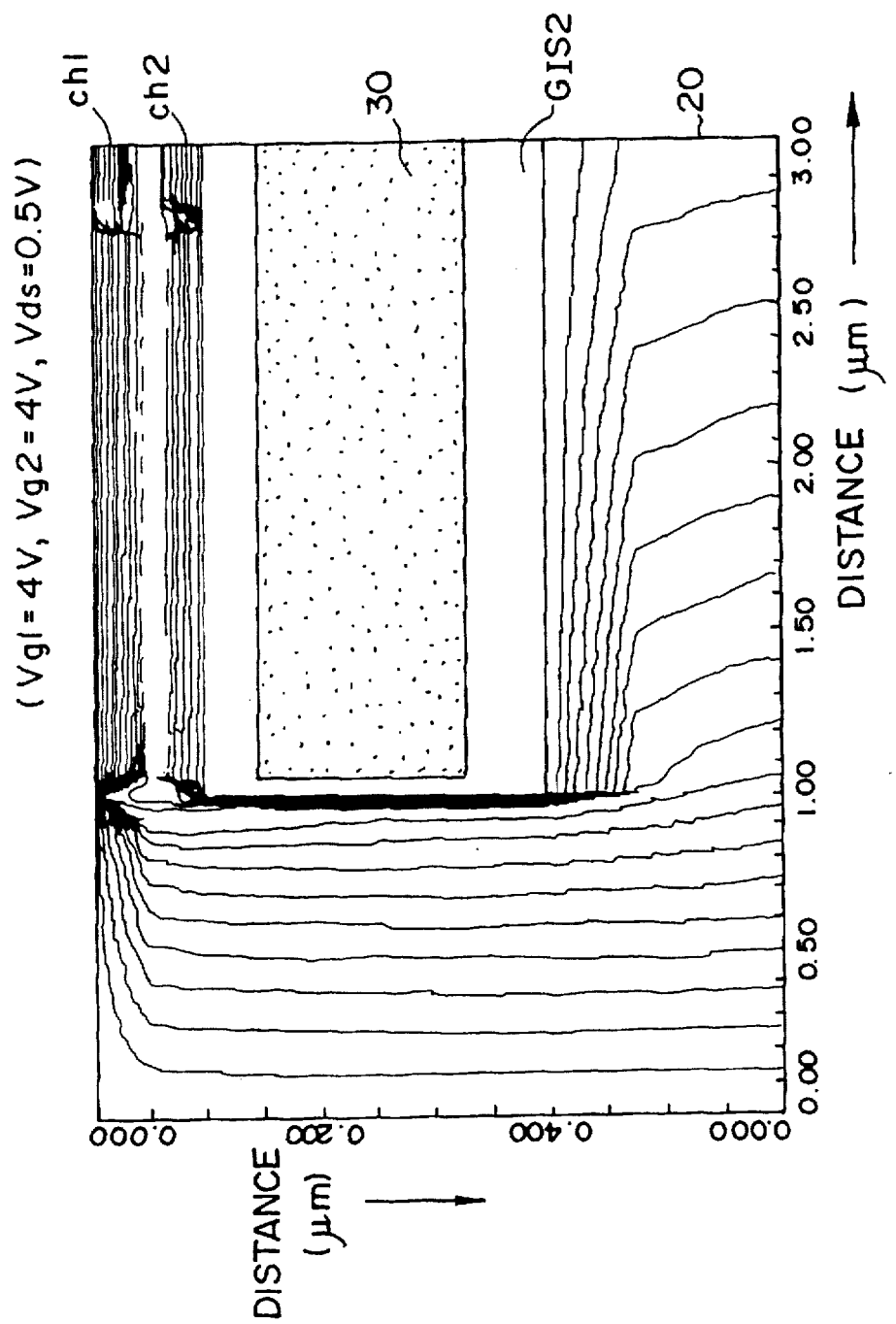
FIG. 6 is a diagram used to illustrate the flow of current when the device of the embodiment of FIG. 1 is on, showing the effect of reducing the JFET resistance by making the current more uniform.

This fact was clarified by the results of computer simulation, as shown in FIG. 6. For comparison, the current flow in the prior art structure is shown in FIG. 7.

Figure 7:
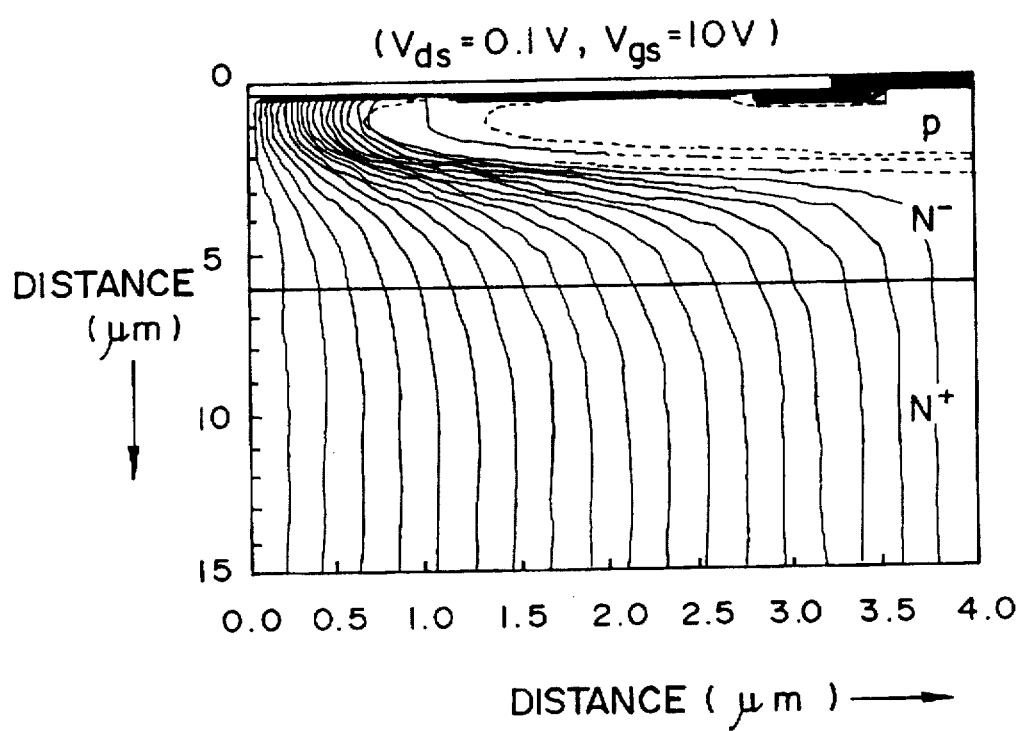
FIG. 7 shows current flow in the prior art device.

It is clear from FIG. 7 that current flowing from the drain in this prior art structure is constricted near the p-type body region, generating the JFET resistance. Conversely, the current flowing in the structure of this embodiment is substantially uniform, as shown in FIG. 5, so that the JFET resistance thereof is much smaller than that in the prior art structure.

Thus this invention exhibits the novel function of forming a carrier accumulation layer in the region of the prior art structure in which the depletion layer is formed. This lowers the JFET resistance $R_{JFET}$ caused by local current concentrations that occur in the prior art structure.

In this manner, all of the channel resistance $R_{ch}$, JFET resistance $R_{JFET}$, and epitaxial layer resistance $R_{epi}$ can be reduced in the device of this embodiment. The result is to reduce the on-resistance $R_{ON}$ to approximately one-fifth of that in the prior art.

d. The second gate 30 is held at a predetermined potential even when the device is off, without floating. If, for example, the gate is driven on and off between 5 V and 0 V, the potential of the second gate 30 is held unchanged at 0 V (ground) when the device is off. When the device is off, the biasing effect of the second gate ensures that the lines of electrostatic potential spread out in a substantially parallel manner in the vertical direction, as shown in FIG. 11B, improving the breakdown voltage over that of the prior art structure.

Figure 11A:
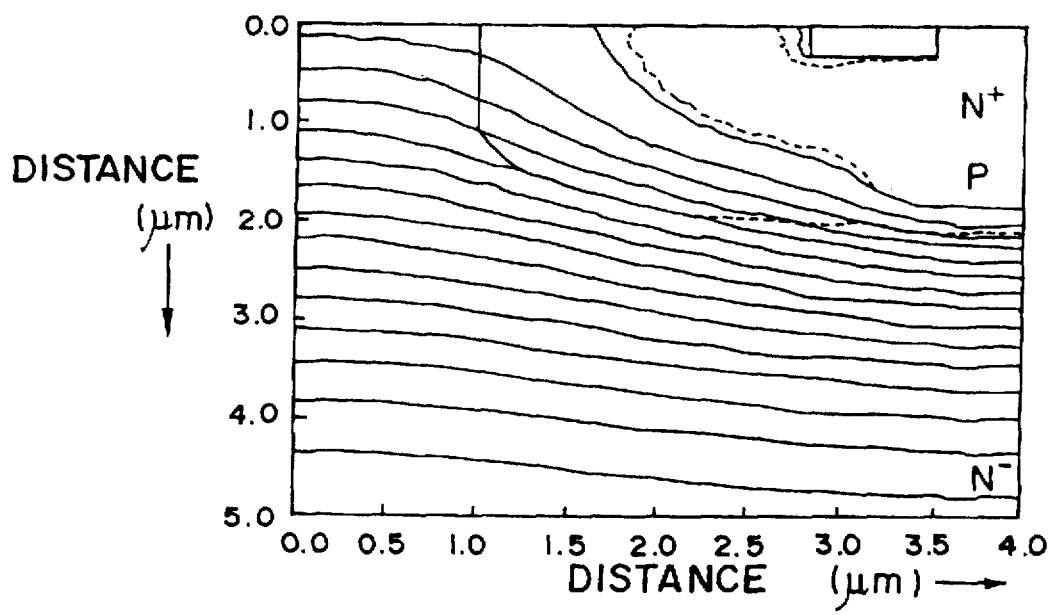
FIG. 11A is a cross-sectional view through the device of a prior art, for comparison.
Figure 11B:
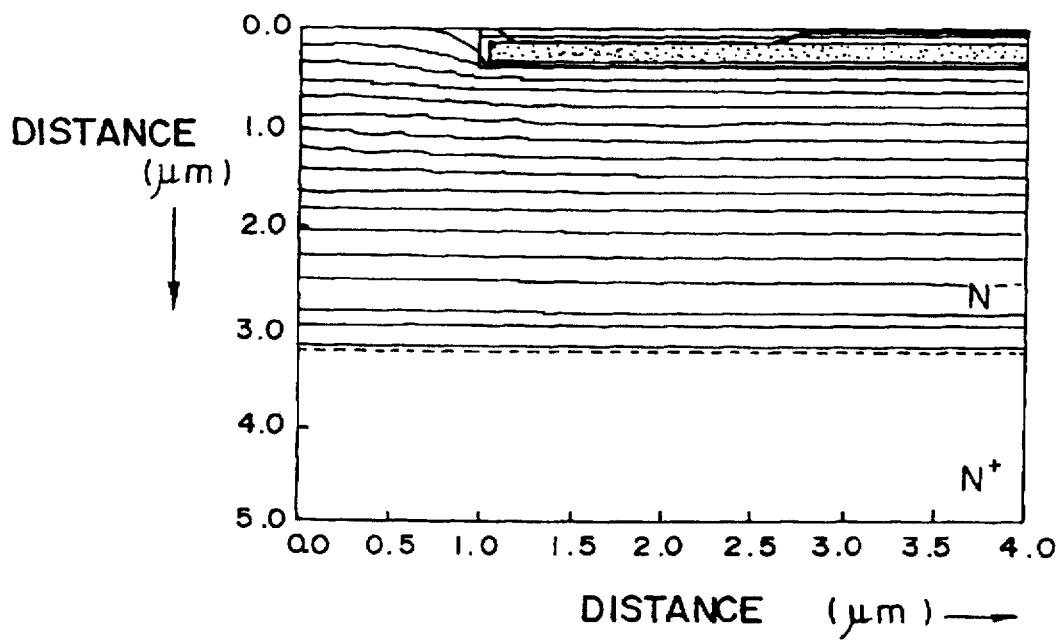
FIG. 11B is a cross-sectional view through the device of the embodiment of FIG. 1, showing the distribution of electrostatic potential when the device is off.

That is, the lines of electrostatic potential in the prior art structure curve as shown in FIG. 11A, and the effects caused by these curves lower the breakdown voltage.

Figure 12:
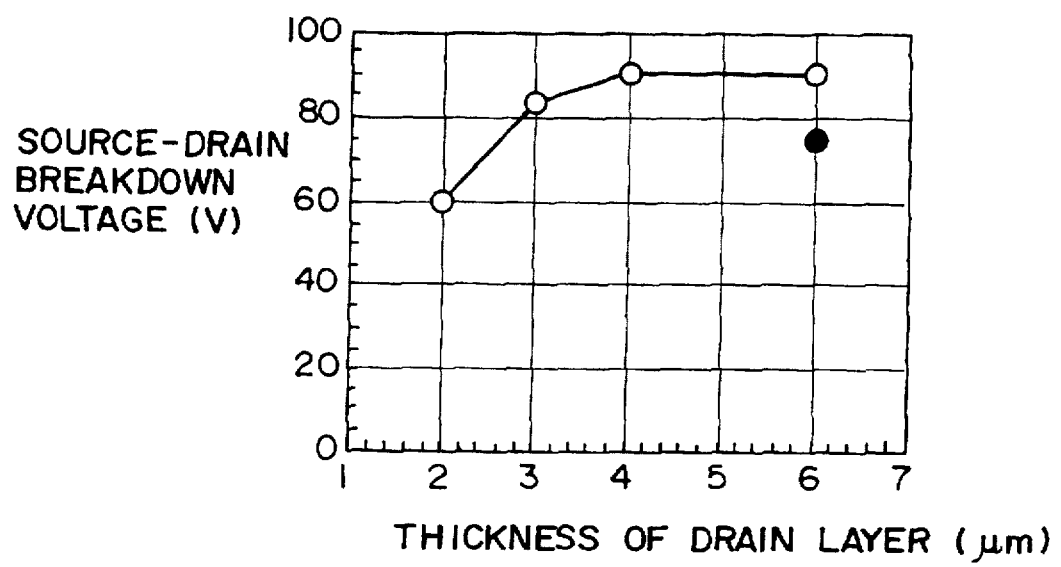
FIG. 12 is a graph showing the relationship between thickness of epitaxial layer and breakdown voltage in the structure of the embodiment of FIG. 1 and the prior art structure.

The relationship between thickness of the n⁻-type drain layer (epitaxial layer) and breakdown voltage was investigated by computer simulation, with the results being as shown in FIG. 12. In this figure, the hollow marks show the data for the structure of this embodiment, shown in FIGS. 1 and 3, and the solid mark shows data for the prior art comparative structure.

As can be seen from this graph, if the thickness of the n⁻-type drain layer in the structure in accordance with this invention is 2 μm, a breakdown voltage of 60 V is obtained. In this case, "breakdown voltage" means a voltage that causes breakdown in the pn junctions of semiconductor elements when a reverse bias is applied thereto. However, it can be seen that a thickness of 6 μm is necessary to achieve a breakdown voltage of 60 V in the prior art. Thus it is clear that, in addition to enabling a reduction in the thickness of the epitaxial layer, the device of this embodiment enables an improvement in breakdown voltage over that in the prior art.

e. This embodiment also makes it possible to form the electrodes 80 and 90 for the first and second gates on the same semiconductor surface. In other words, it implements a planar structure for these electrodes. This facilitates fabrication of the device.

f. The structure of this embodiment also makes it simple to completely deplete the channel region.

In other words, since an extremely narrow region sandwiched between the first and second gates becomes a channel region in the structure of this embodiment, it is possible to implement a complete-depletion type of power MOS. Putting the channel region in a completely depleted state to alleviate the electrical field and increase carrier mobility has been proposed in the prior art. Therefore, the on-resistance can be further reduced by using this technique of completely depleting the channel region.

Figure 4A:
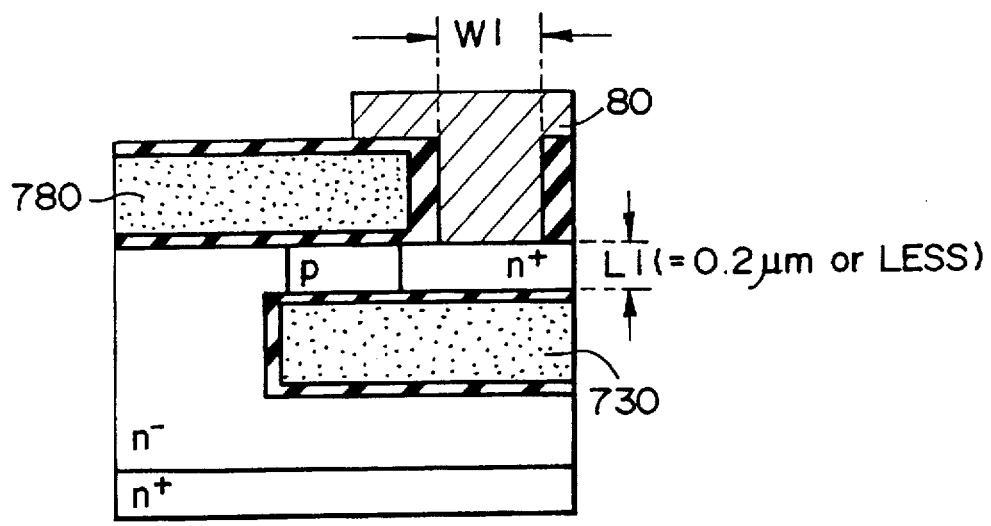
FIG. 4A is a diagram used to illustrate the technique of completely depleting the channel region, showing the structure of a power MOS transistor in accordance with this invention by way of example.
Figure 4B:
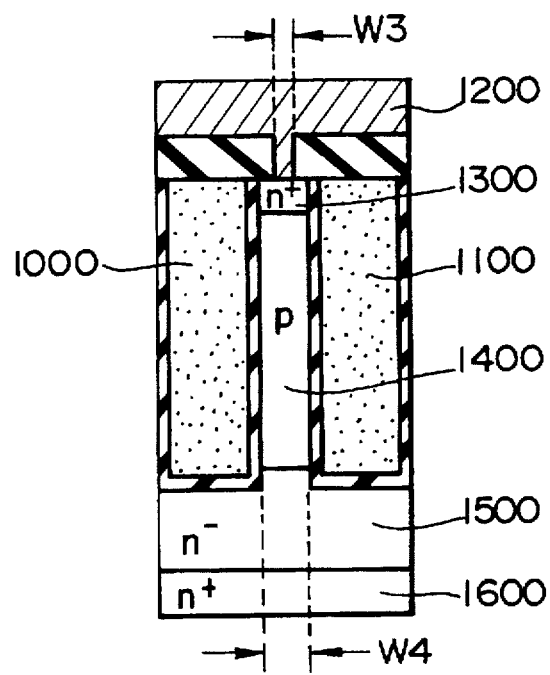
FIG. 4B is a cross-sectional view through a prior art device, for comparison.
Figure 45:
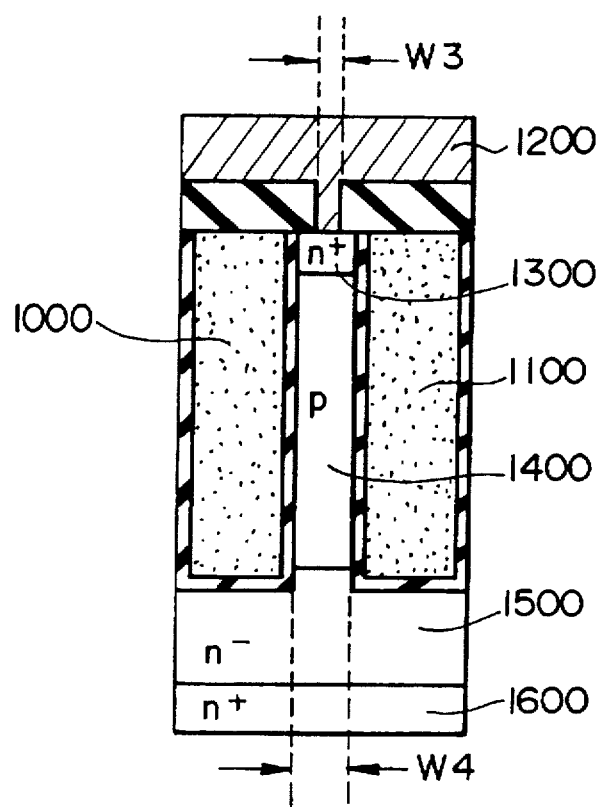
FIG. 45 is a diagram showing the structure of a prior art device proposed to implement complete depletion of the channel region.
Figure 46:
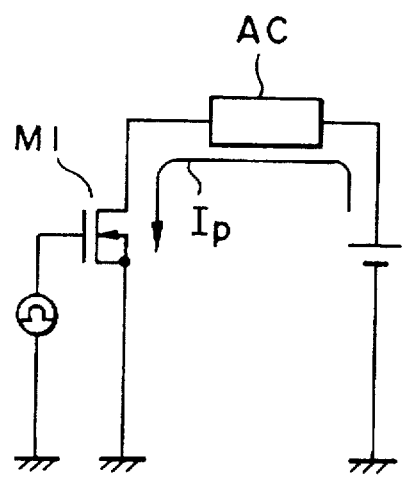
FIG. 46 is a diagram used to illustrate an example of the application of this power MOS device.

An example in the prior art of a power MOSFET that uses complete depletion of the channel region is shown in FIG. 4B (and FIG. 45). In this prior art example, a source region 1300 and a channel region 1400 are formed between two trench gates 1000 and 1100. The width W4 of this channel is, for example, 0.1 μm.

However, the accurate fabrication of such a compact structure is difficult in practice, and it is also difficult to ensure a reliable connection of a source electrode 1200 to the source region 1300.

In contrast, the structure of this embodiment shown in FIG. 4A can be fabricated with ordinary LSI fabrication techniques, and it is also extremely simple to form the source electrode 80. The width W1 of the electrode contact region in FIG. 4A could be, for example, 2 μm.

3. Operation

The operation of the device of this embodiment will be described below in detail.

Operation When The Device Is On

If a positive voltage (of, for example, 4 V) with respect to the source region 50 is applied to the first gate 60 and second gate 30 in the structure of FIG. 1, a first channel Ch1 is formed in the channel region 40 directly under the interface with the gate insulating film GIS1 and a second channel Ch2 is formed in the vicinity of the interface with gate insulating film GIS2 above the first portion 30-a of the second gate 30, thus turning the power MOSFET on.

During this time, carriers (electrons) accumulate at the surface of the second and third portions 30-b and 30-c that are connected to the first portion 30-a, and thus an extremely low-resistance layer (carrier accumulation layer) is formed. In other words, an electron accumulation layer 110 is formed as shown the right side of FIG. 2.

Current flows through the second channel Ch2 and this carrier accumulation layer 110. This current path is specific to this embodiment, and it is not seen in the prior art structure. The only current path in the prior art structure is through the first channel Ch1.

Figure 2:
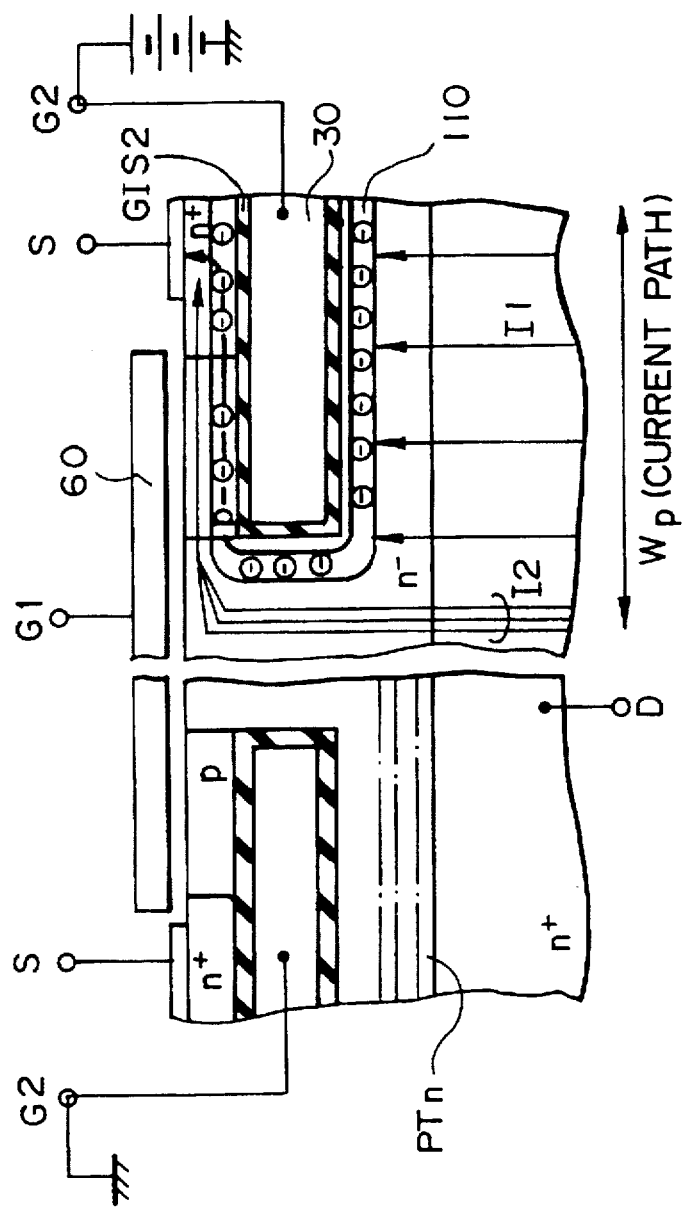
FIG. 2 is a diagram used to summarize the features of the embodiment of FIG. 1.

In this embodiment, two current paths are formed, which one is through the first channel Ch1 and the another, new one is through the carrier accumulation layer in the vicinity of the second channel Ch2 and the second gate, and the current flows therethrough, as shown in FIGS. 2, 5 and 6. Thus the channel cross-sectional area is doubled and the channel resistance is reduced to approximately half that in the prior art.

The presence of the electron accumulation layer 110 shown the right side of FIG. 2 causes a drain current I1 to flow uniformly and perpendicularly towards the entire lower surface of the buried second gate 30. Therefore the width WP of the current path as seen from the drain D is wide, alleviating the current density.

Figure 8:
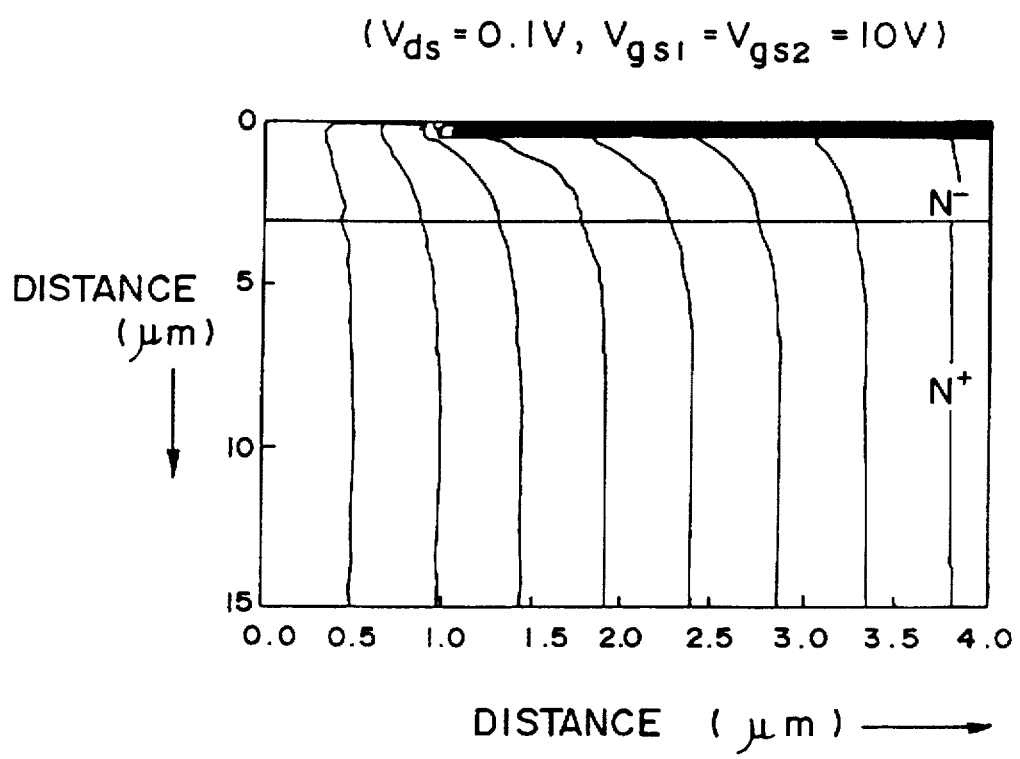
FIG. 8 is a diagram used to illustrate the effect of the second gate in the embodiment of FIG. 1.

The current flow in the device of this embodiment is shown in FIG. 8 and that of the prior art is shown in FIG. 7. As is clear from a comparison of FIGS. 7 and 8, there are virtually no our rent concentrations in the surface of the semiconductor substrate of the device of this embodiment, and the JFET resistance $R_{JFET}$ is suppressed.

The main reason for this lack of current concentrations in this embodiment is that there is no expansion of the depletion layer toward the drain. In other words, the depletion layer in the prior art expands into the drain, as shown by broken lines in FIG. 7.

In contrast, no expansion of the depletion layer is seen in the structure of this embodiment, as shown in FIG. 8, and this difference is expressed as a difference in current distribution between the device of this embodiment and the prior art when the device is on.

Figure 9:
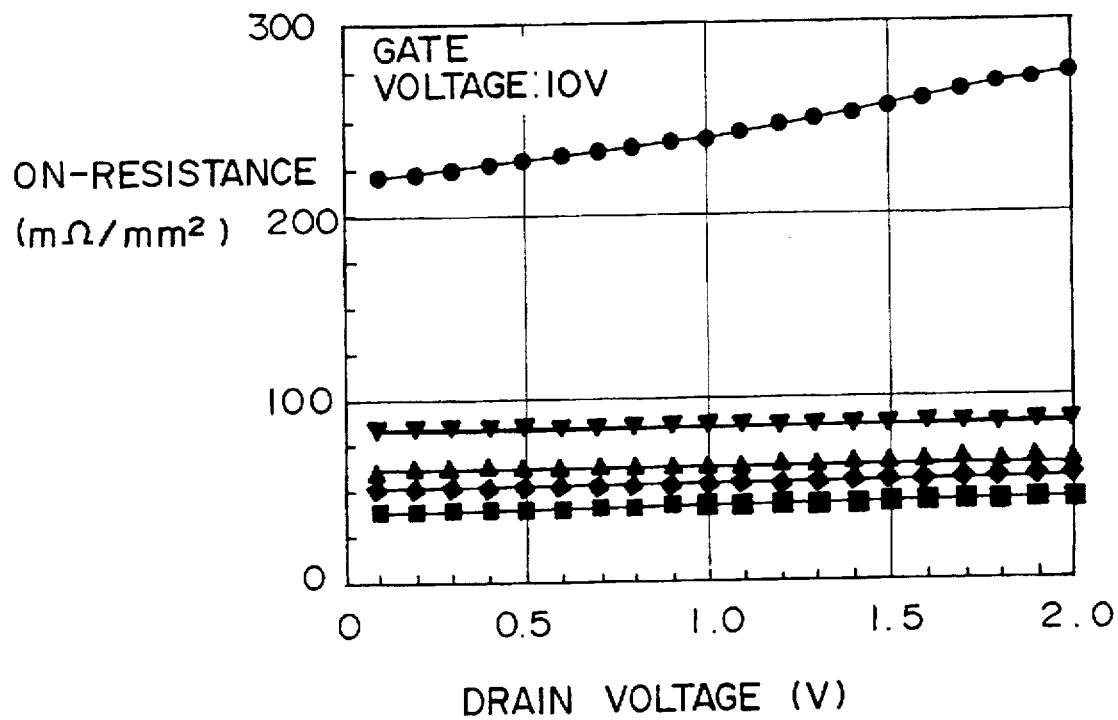
FIG. 9 is a graph showing the relationship between drain voltage (the abscissa) and on-resistance (the ordinate) in the embodiment of FIG. 1 when the gate voltage is 10 V.

The relationship between on-resistance and drain voltage for various thicknesses of n⁻-type drain layer when the gate voltage is 10 V is shown in FIG. 9.

The line drawn at the top of this graph shows the characteristic of the prior art structure. It is clear from this graph that the on-resistance in the structure of this embodiment is a fraction of that of the prior art.

The relationship between on-resistance and drain voltage for various thicknesses of n⁻-type drain layer when the gate voltage is 4 V is shown in FIG. 10. The line drawn at the top of this graph shows the characteristic of the prior art structure. The structure of this embodiment has an on-resistance that is reduced to a fraction of that of the prior art. This shows that the device of this embodiment can use a common power source, such as an IC that operates by a single 5-V power source.

Operation When The Device Is Off

When the device is off, the first and second gates are both maintained at a certain level, such as ground level. This improves the breakdown voltage.

The potential forms corner portions in the prior art when the device is off, as shown in FIG. 11A, making it easy for breakdown to occur in these corner portions, thus lowering the breakdown voltage. In contrast, the electrostatic potential PTn in this embodiment is distributed uniformly, as shown in the left side of FIG. 2, so that the breakdown voltage is improved.

In other words, the structure of this embodiment distributes electrostatic potential in a parallel manner and uniformly to the second gate, as shown in FIG. 11B, rearranging the form of the potential distribution. This potential distribution greatly improves the breakdown voltage over that of the prior art.

The relationship between thickness of the n⁻-type drain layer and the breakdown voltage was investigated in the structures of this embodiment and the prior art, with the results being as shown in FIG. 12. In this figure, the hollow marks show the data for the structure of this embodiment, and the solid mark shows data for the prior art comparative structure.

It can be seen from this graph that a breakdown voltage of 60 V is obtained for a 2-µm drain layer in the structure of this invention, but a thickness of 6 µm is required in the prior art to achieve a breakdown voltage of 60 V. Thus it is clear that the structure of this embodiment enables both a reduction in the thickness of the epitaxial layer and an improvement in the breakdown voltage over that of the prior art.

Note that the first and second gates should be driven together, in principle, and that use of such a driving method is most preferable for expressing the effects of the device of this invention to the maximum. However, it is feasible to drive only one gate, depending on the application. Therefore the present invention is not to be taken as being limited to having the two gates driven simultaneously. It is possible to employ a method in which the gates are driven independently.

4. Fabrication Process

The process used to fabricate the structure of the embodiment of FIG. 1 will now be described with reference to FIGS. 13 to 34, where FIGS. 13 to 23 are cross-sectional views of the device at each step of the process and FIGS. 24 to 34 are plan views thereof.

These steps are described below in sequence.

Figure 13:
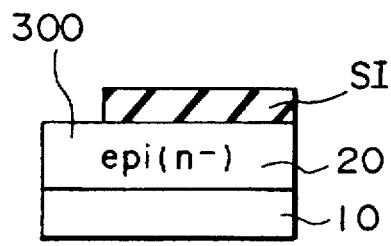
Figure 24:
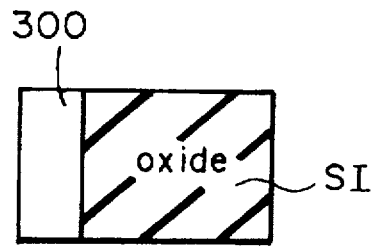
FIGS. 24 to 34 are plan views of the device, showing first to eleventh steps, respectively in the method of fabricating the structure of the embodiment of FIG. 1 (corresponding to FIGS. 13 to 23, respectively)

Step 1 (FIGS. 13 and 24)

An n⁻-type epitaxial layer 20 is formed on an n⁺-type semiconductor substrate 10, then an oxide film SI is formed thereon and patterned.

The remaining oxide film acts as a spacer for the formation of the second gate. A portion 300 of the surface of the n⁻-type epitaxial layer 20 that is exposed by the removal of the oxide film will later act as seeds (a seed portion) for the crystallization of the layer when solid phase epitaxy is performed.

Figure 14:
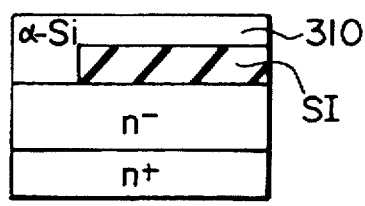
Figure 25:
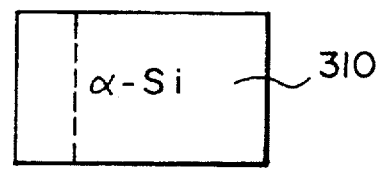

Step 2 (FIGS. 14 and 25)

An amorphous semiconductor layer 310 is formed over both the seed portion 300 and the oxide film SI. In other words, a non-singlecrystalline layer is formed in this step.

Figure 15:
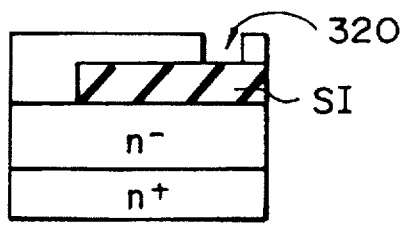
Figure 26:
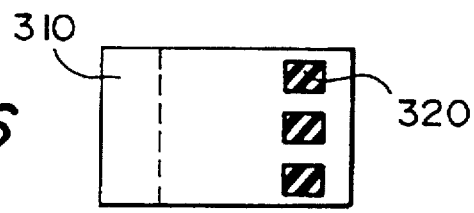

Step 3 (FIGS. 15 and 26)

An aperture portion 320 is formed in part of the amorphous semiconductor layer 310 in such a manner as to expose part of the surface of the oxide film SI.

Figure 16:
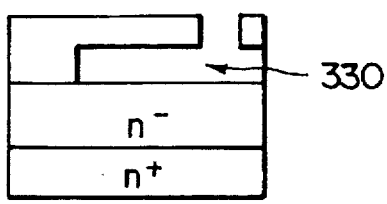
Figure 27:
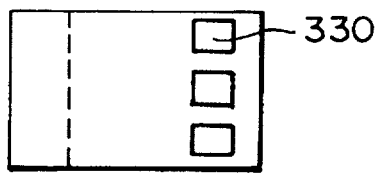

Step 4 (FIGS. 16 and 27)

An etchant is supplied through the aperture portion 320, and the oxide film is completely removed by etching therewith to form a cavity portion 330 corresponding to the portion that was occupied with the oxide film up to that point.

Figure 17:
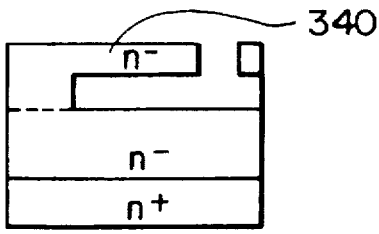
Figure 28:
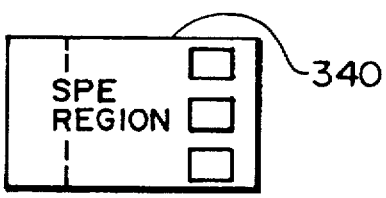

Step 5 (FIGS. 17 and 28)

Thermal treatment (annealing) is performed to initiate solid phase epitaxy (SPE) with the portion of the amorphous semiconductor layer 310 that is in contact with the surface of the seed portion 300 acting as a starting point. This converts the amorphous semiconductor layer into a single crystal to obtain an n⁻-type singlecrystalline layer 340.

Recrystallization of the amorphous semiconductor layer can also be done by laser or electron beam irradiation.

Figure 18:
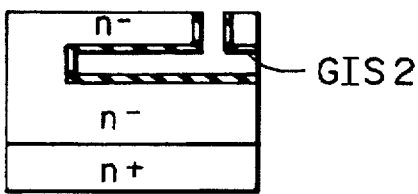
Figure 29:
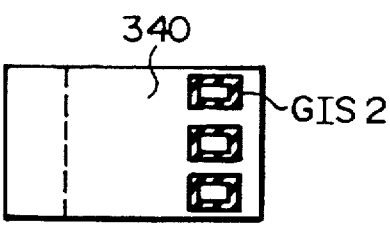

Step 6 (FIGS. 18 and 29)

An insulating layer is formed by oxidation of the inner surface of the cavity portion 330. This insulating layer becomes a second gate oxide film GIS2.

Figure 30:
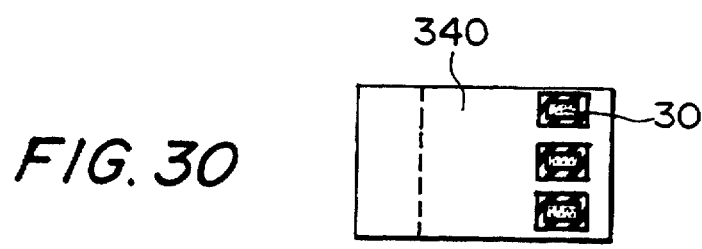

Step 7 (FIGS. 19 and 30)

The cavity is filled with a conductive material, such as doped polysilicon to form the second gate 30.

Figure 31:
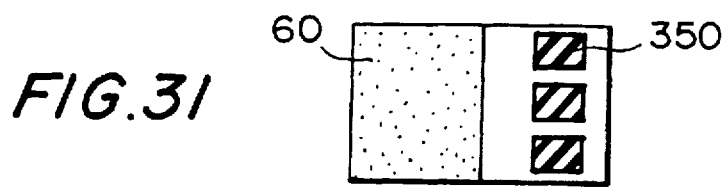

Step 8 (FIGS. 20 and 31)

The gate insulating film GIS1 is formed on the surface of the singlecrystalline layer, a conductive material such as polysilicon is deposited on the gate insulating film GIS1, and this material is patterned to form the first gate 60.

Figure 32:
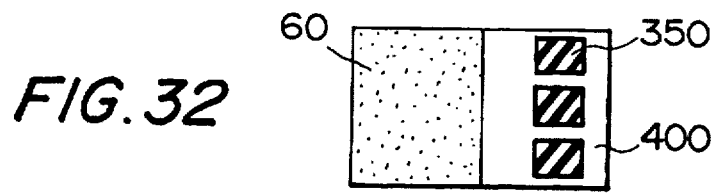

Step 9 (FIGS. 21 and 32)

The first gate 60 is used as a mask for implantation of p-type impurities into the single crystalline layer in order to form the p-type region. After implantation and thermal treatment, a p-type body layer 400 is formed in the singlecrystalline substrate.

Figure 33:
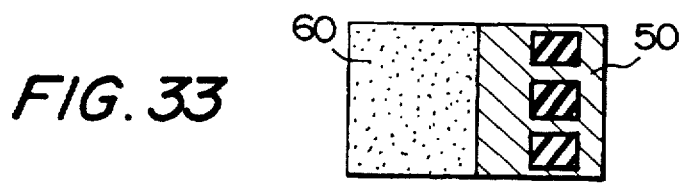

Step 10 (FIGS. 22 and 33)

Using the first gate 60 as a mask, an n-type impurity is doped into the p-type body layer 400 by ion implantation to form the n⁺-type source region 50, and, as a result, the p-type channel region 40 is formed in a portion sandwiched between the first gate and the second gate.

Figure 34:
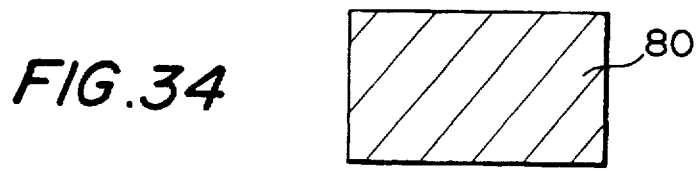

Step 11 (FIGS. 23 and 34)

The inter-layer insulating film 70 and the source electrode 80 are formed on the surface of the substrate. A drain electrode 84 is formed on the rear surface of the substrate. This completes the fabrication of the structure of the embodiment of FIG. 1.

This structure can be fabricated by the technique of stacking layers, such as silicon-on-insulator (SOI) techniques used in the configuration of three-dimensional devices. Thus there is no need for the excess etching of the singlecrystalline semiconductor substrate that can occur with RIE during the fabrication of the UMOS transistor of the prior art. In this embodiment, a carrier mobility that is at least equivalent to that of an ordinary bulk device can be obtained at the boundary between the recrystallized portion and the surface of the second gate.

The gate insulating film of the second gate can be formed in the same manner as that of an ordinary planar MOSFET, and thus the degree of control over the thickness thereof is similar to that of conventional LSI fabrication techniques. The channel region can be formed by diffusion self-alignment (DSA), using the polysilicon windows, and thus the degree of control over the channel length can be ensured to be similar to that of conventional LSI fabrication techniques. Therefore the configuration of this embodiment, having a double-gate structure, can be fabricated extremely accurately and with good repeatability.

It should be noted that the steps in the fabrication process depicted in FIGS. 13 to 23 (FIGS. 24 to 34) need not necessarily be performed in the sequence shown in these figures, and these steps can be rearranged as required. For example, the step of converting the amorphous semiconductor layer 310 into a single crystal (FIGS. 17 and 28) could equally well be performed after the step of depositing the amorphous semiconductor layer (FIG. 14) is completed, or after the step of forming the aperture portion 320 in the amorphous semiconductor layer 310 (FIG. 15) has been completed.

The structure of this embodiment could equally well be fabricated by another method shown in FIGS. 35 to 39.

The fabrication method of FIGS. 35 to 39 differs from the previously described method in the manner in which the buried gate electrode is formed. In other words, in the previously described method, a cavity is formed by removing an oxide film that acts as a spacer and then this cavity is filled with a conductive material, but in this embodiment, the buried gate electrode is formed first and then the recrystallized region is formed on the gate electrode. This process will be described below, with reference to the accompanying drawings.

Figure 35:
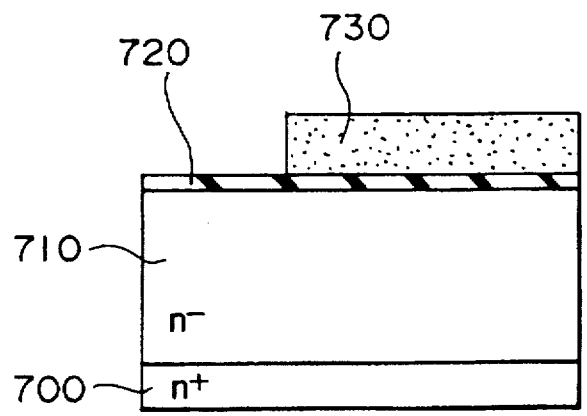
FIGS. 35 to 39 are cross-sectional views through the device, showing first to fifth steps, respectively, in another method of fabricating the structure of the embodiment of FIG. 1.

Step 1 (FIG. 35)

An oxide film 720 is formed on the substrate surface and a gate electrode (polysilicon electrode) 730 is formed on the oxide film 720.

Figure 36:
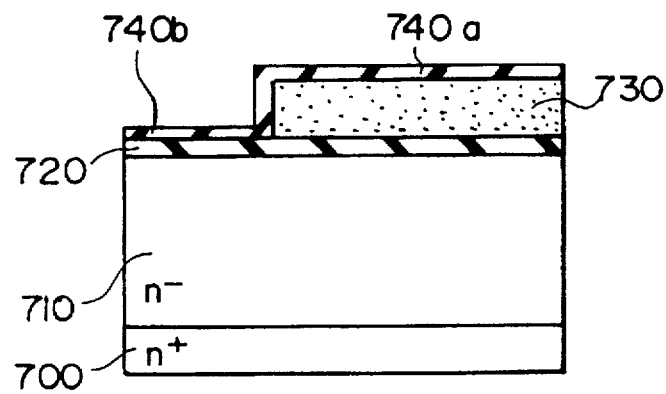

Step 2 (FIG. 36)

An insulating film (oxide film or nitride film) 740a and 740b is then formed by a method such as CVD. Note that this insulating film (oxide film or nitride film) 740a and 740b could equally well be formed by oxidation of the gate electrode (polysilicon electrode) 730.

Figure 37:
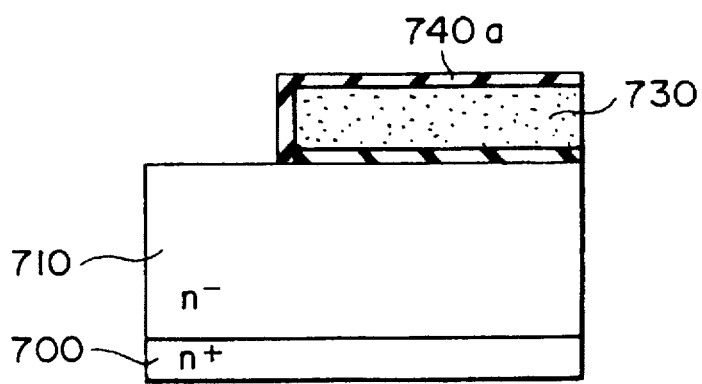

Step 3 (FIG. 37)

Parts of the insulating films 720 and 740b are selectively removed, exposing part of the surface of the semiconductor substrate.

Figure 38:
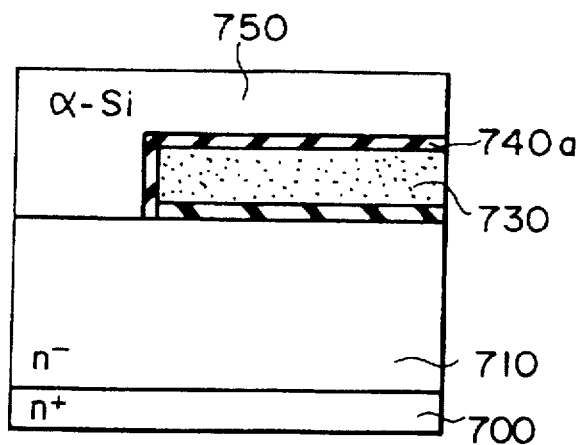

Step 4 (FIG. 38)

An amorphous silicon layer (a non-singlecrystalline layer) 750 is formed and the amorphous silicon layer 750 is crystallized by a thermal treatment, to obtain a singlecrystalline layer 760.

Figure 39:
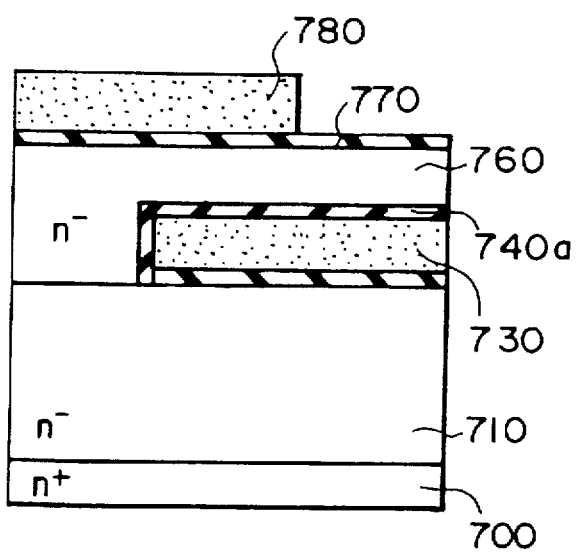

Step 5 (FIG. 39)

Figure 40:
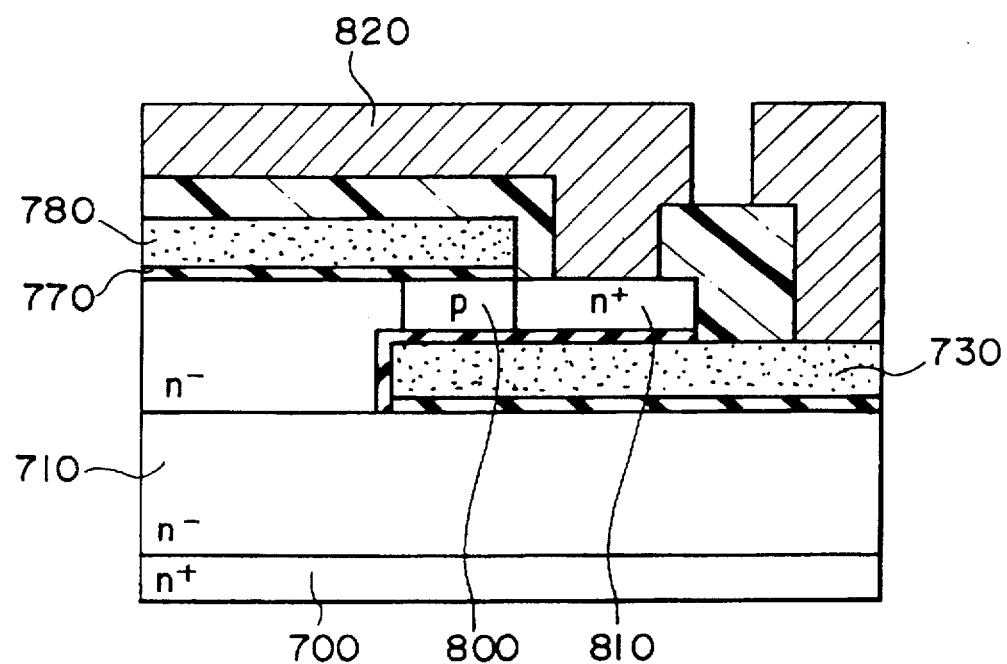
FIG. 40 is a cross-sectional view through the device, showing a final step in another method of fabricating the structure of the embodiment of FIG. 1.

A gate oxide film 770 and a gate electrode 780 are formed on the substrate surface. Subsequent steps are the same as those described above (FIGS. 22 and 23), until the structure shown in FIG. 40 is obtained.

Embodiment 2

Figure 41:
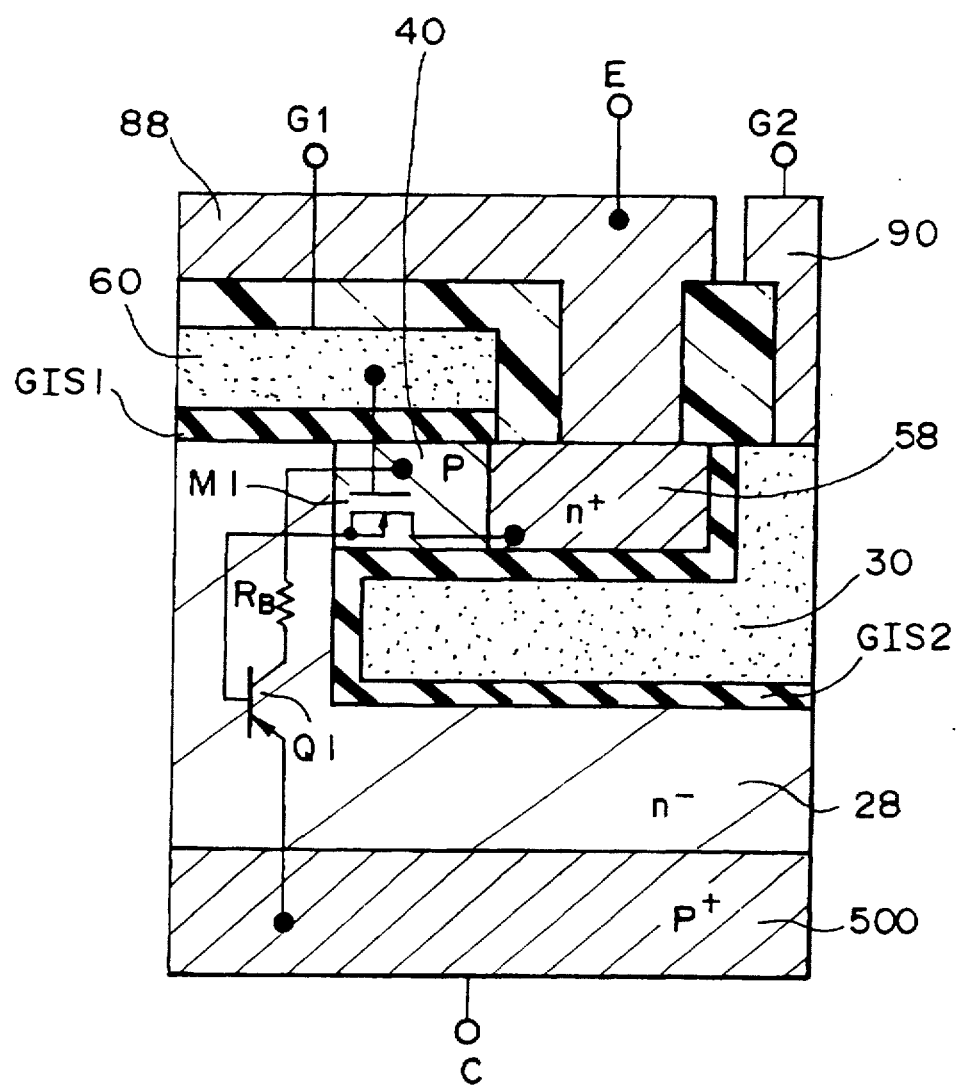
FIG. 41 is a cross-sectional view showing the structure of a second embodiment (IGBT) of this invention.

A cross-sectional view through the structure of an insulated gate bipolar transistor in a second embodiment of this invention is shown in FIG. 41. The structure of this embodiment is such that the n⁺-type drain layer 10 of the first embodiment is replaced by a p⁺ layer 500.

Figure 42:
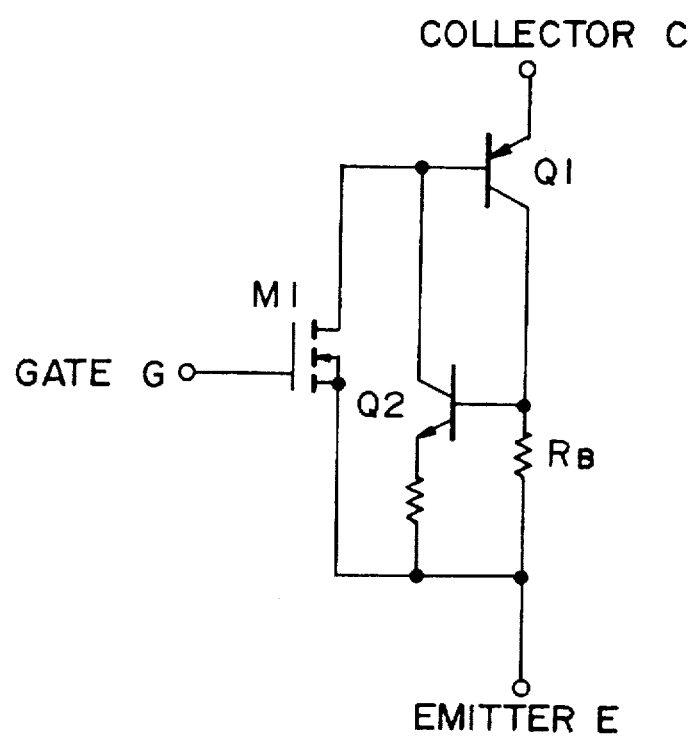
FIG. 42 is an equivalent circuit diagram for this IGBT.
Figure 43:
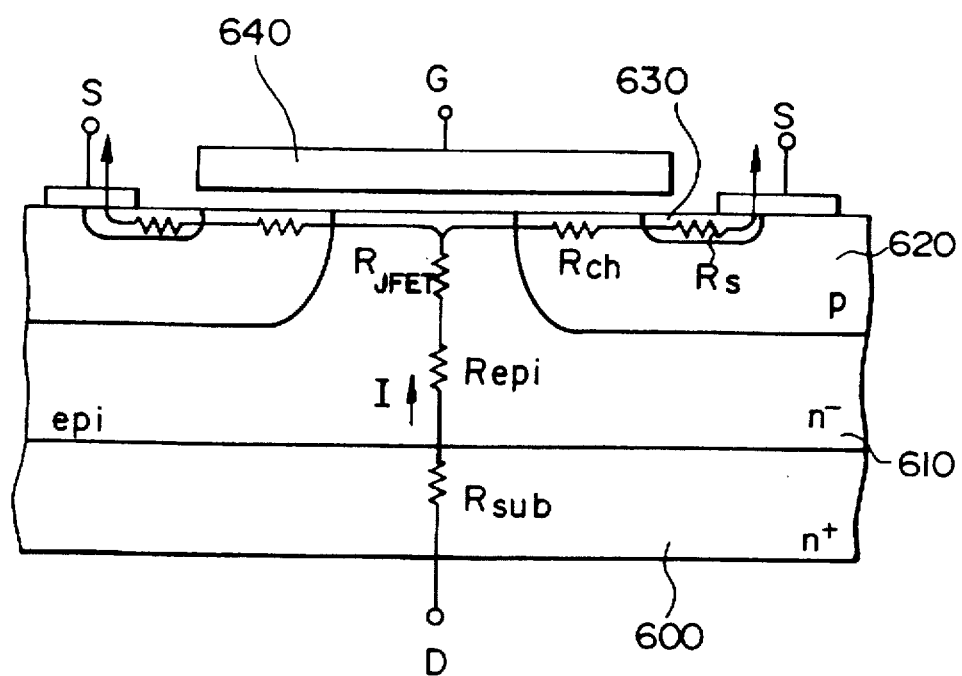
FIG. 43 is a diagram used for illustrating the causes of the generation of an on-resistance in a prior art power device.
Figure 44:
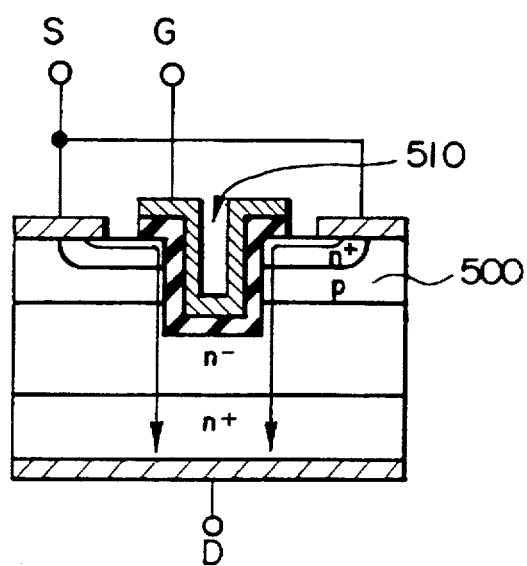
FIG. 44 is a diagram showing the structure of a prior art device (UMOS transistor) that uses a U-shaped groove.

This structure constitutes a Darlington pair of complementarily-connected transistors in which the power MOS transistor M1 acts as the input-stage transistor and a pnp bipolar transistor Q1 acts as an output-stage transistor, as shown in FIG. 42.

This embodiment enables reductions in the channel resistance and JFET resistance that are similar to those of the previously described embodiment.

It should be noted that, although the above embodiments are described with reference to n-channel elements, this invention can equally well be applied to p-channel elements. This invention can also be applied widely to all types of insulated gate power devices.

What is claimed is:

1. A vertical semiconductor device with an insulated gate structure comprising:

a semiconductor substrate as a drain region;

a channel region formed within the semiconductor substrate;

a source region formed in contact with said channel region; and a first gate and a second gate formed on one surface side of the semiconductor substrate, said first and second gates being electrically insulated from the semiconductor substrate and having mutually opposing portions;

wherein:

first and second channels corresponding to said first and second gates are formed in said channel region by driving said first and second gates so that currents flow through said first and second channels from another surface side of the semiconductor substrate to said one surface side thereof;

said first gate is provided on one surface of said semiconductor substrate and said second gate is formed within said semiconductor substrate to have a buried portion encased within said semiconductor substrate, said first gate and said buried portion of said second gate extending in substantially parallel directions with respect to said one surface of said semiconductor substrate: and a region interposed between said first gate and said buried portion of said second gate forms said channel region.

2. The vertical semiconductor device as defined in claim 1, wherein the thickness of said channel region in the vertical direction is less than the length of said first and second channels formed in said channel region.

3. The vertical semiconductor device as defined in claim 1, wherein a voltage of said second gate is fixed at a predetermined level when said insulated gate semiconductor device is in an off state.

4. The vertical semiconductor device as defined in claim 1, wherein:

said second gate is provided with an electrode contact portion which is connected to said buried portion and which is partially exposed on part of said one surface of said semiconductor substrate, and an electrode for driving said second gate is formed on said one surface of said semiconductor substrate and is connected to said electrode contact portion.

5. The vertical semiconductor device as defined in claim 1 wherein said first and second gates are driven synchronously.

6. The vertical semiconductor device as defined in claim 1 wherein said channel region is completely depleted after said first and second channels have been formed.

7. The vertical semiconductor device as defined in claim 1 wherein said insulated gate semiconductor device is a power MOSFET.

8. The vertical semiconductor device as defined in claim 1 wherein said insulated gate semiconductor device is an insulated gate bipolar transistor (IGBT).

9. The vertical semiconductor device as defined in claim 1, wherein said semiconductor substrate comprises:

a first substrate which is a high-concentration layer and has a drain electrode on a surface thereof; and a second substrate which is a low-concentration layer and has said buried portion of said second gate;

wherein said first gate and said buried portion of said second gate are provided in parallel directions with respect to said first substrate, and at least one of said first gate and said buried portion of said second gate overlaps with said first substrate when said vertical semiconductor device is viewed in a direction perpendicular to said first substrate.

10. The vertical semiconductor device as defined in claim 9, wherein said second substrate includes a part of said drain region partially surrounded by said first gate and said two adjacent buried portions via an insulating film.

11. The vertical semiconductor device as claimed in claim 1, wherein said source region and said buried portion of said second gate overlap one another in a direction perpendicular to said semiconductor substrate.

* * * * *